United States Patent [19]

Dumoulin

[11] Patent Number: 5,469,059
[45] Date of Patent: * Nov. 21, 1995

[54] METHOD FOR THE SIMULTANEOUS DETECTION OF ACCELERATION AND VELOCITY DISTRIBUTION IN MOVING FLUIDS

[75] Inventor: Charles L. Dumoulin, Ballston Lake, N.Y.

[73] Assignee: General Electric Company, Schenectady, N.Y.

[ * ] Notice: The portion of the term of this patent subsequent to Jul. 25, 2012, has been disclaimed.

[21] Appl. No.: 175,448

[22] Filed: Dec. 30, 1993

[51] Int. Cl.⁶ .................................................... G01R 33/20
[52] U.S. Cl. ............................................................ 324/306
[58] Field of Search ...................... 324/306, 309, 324/300, 307; 128/653.3

[56] References Cited

U.S. PATENT DOCUMENTS

| | | | |
|---|---|---|---|
| 4,849,697 | 7/1989 | Cline et al. | 324/306 |
| 5,038,784 | 8/1991 | Dumoulin | 324/306 |
| 5,115,812 | 5/1992 | Sano et al. | 324/306 |
| 5,133,357 | 7/1992 | Dumoulin et al. | 324/306 |
| 5,233,298 | 8/1993 | Dumoulin | 324/306 |

*Primary Examiner*—Sandra L. O'Shea
*Assistant Examiner*—Raymond Y. Mah
*Attorney, Agent, or Firm*—Lawrence P. Zale; Marvin Snyder

[57] ABSTRACT

A motion imaging method uses magnetic resonance to detect acceleration, and an velocity distribution within moving materials in a subject. Acceleration encoding is performed by computing differences of data obtained with modulated motion-encoding magnetic field gradient pulses. Distributions of velocity are measured responsive to a motion sensitive phase-encoding gradient pulse.

2 Claims, 8 Drawing Sheets

METHOD FOR THE SIMULTANEOUS DETECTION OF ACCELERATION AND VELOCITY DISTRIBUTION IN MOVING FLUIDS

BACKGROUND OF THE INVENTION

1. Field of the Invention

The present invention relates to the field of magnetic resonance imaging and more specifically to the field of imaging moving matter with magnetic resonance.

2. Description of Related Art

Motion, particularly that of fluids, is an important parameter in many systems. Information of the gradients in velocity and acceleration is useful in design and analysis of fluid flow systems. Gradients in velocity and acceleration indicate regions of potential turbulence, and stagnant areas. These may lead to corrosion in metal pipes, areas of blockage, etc. Also, regions of slow flow through vessels of living subjects have been shown to play a central role in the in-vivo development of arteriosclerotic disease.

A traditional fluid flow analysis method, known as ink streamlining, requires introducing a contrast agent into a flowing fluid and observing the motion of the contrast agent.

Another method of measuring motion of materials employs laser Doppler technique. This requires a laser beam to be reflected from particles suspended in the material which is to be measured, and determining the displacement of each particle over a short interval thereby indicating the velocity of the material at the chosen location.

Both of these methods are invasive, or destructive, and require direct access to the material being tested. If the material is in inside a tube or deep within a living subject, these methods will not be useful. Furthermore, they are not suited for in-vivo, or non-destructive testing applications.

A number of methods for the detection and measurement of fluid motion with magnetic resonance have been previously disclosed. These methods use either a bolus tracking approach in which the magnetization of a bolus of moving fluid is changed and followed, or they use approaches in which motion-encoding magnetic field gradient pulses are used to induce a phase shift which is proportional to a desired component of motion such as velocity, acceleration and jerk. Prior methods for the detection of motion with magnetic resonance are limited in their application since only a single component of motion can be detected at a time.

It would be useful to have a method which non-invasively measures several components of motion simultaneously.

SUMMARY OF THE INVENTION

Methods employing magnetic resonance (MR) pulse sequences for the acquisition of images containing information from more than one component of motion are disclosed. These pulse sequences are comprised of a slice-selective RF pulse and a conventional readout gradient pulse for spatial encoding. At least two motion encoding gradient pulses are incorporated into the pulse sequence. Motion encoding gradient waveforms can be bipolar to encode velocity as a phase shift in the resulting image, tri-polar to encode acceleration as a phase shift in the resulting image, or have a higher number of lobes to encode higher orders of motion.

The motion encoding gradients are applied in one of two ways. The first motion encoding gradient is applied with a selected amplitude, but is modulated in polarity during subsequent acquisitions. Data acquired responsive to this modulation is processed by computing differences, to extract the component of data arising from the first motion encoding gradient. The second motion encoding gradient pulse (as well as all additional motion encoding pulses, if present) are applied with varying amplitudes to form a phase-encoding dimension of the image.

Motion encoded in this form is resolved by the application of a Fourier transformation with respect to the changing pulse amplitudes. A motion dimension provides a means of assessing the distribution of a motional parameter such as velocity within a subject.

OBJECTS OF THE INVENTION

It is an object of the present invention to provide a method for the simultaneous detection and display of two or more selected component of motion within a subject. It is another object of the present invention to provide a method for the detection and display of two orthogonal components of velocity within a subject.

It is another object of the present invention to provide a method for the detection and display of velocity and acceleration within a subject.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

In the present embodiment of the invention, a subject is placed within the magnet of a magnetic resonance imaging system. The region over which a motional component image is desired is then identified by an operator, perhaps with the assistance of a conventional MR imaging sequence. A pulse sequence is then applied and the data analyzed.

Figure 1:
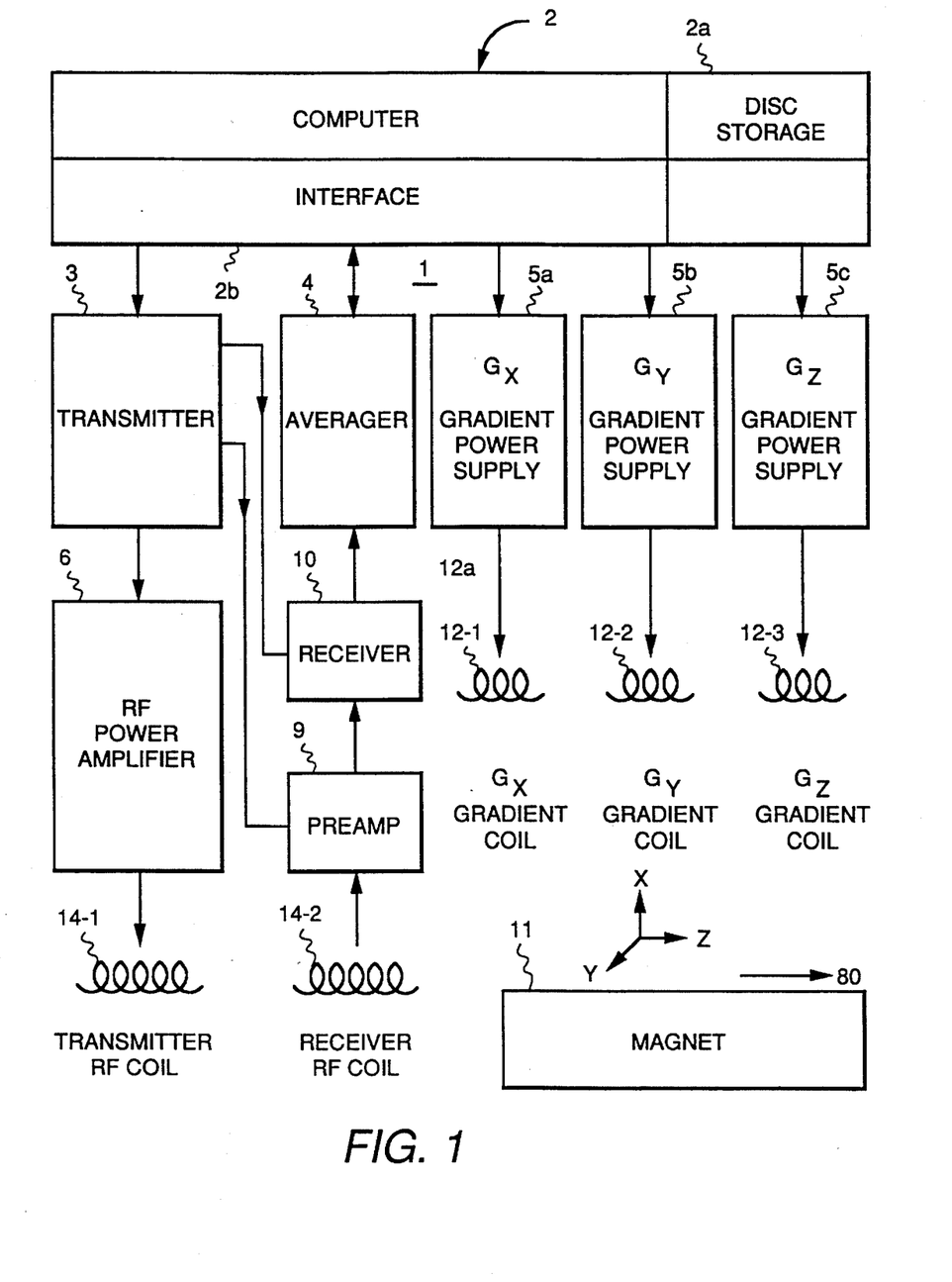
FIG. 1 is a simplified block diagram of a magnetic resonance (MR) imaging system suitable for use with the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b and 5c energize gradient coils 12-1, 12-2 and 12-3 to create magnetic field gradients Gx, Gy and Gz, respectively, in the "X", "Y" and "Z" directions respectively, over a subject to be imaged. RF transmitter 3 is gated with pulse envelopes from computer 2 to generate RF pulses having the required modulation to excite an MR response signal from a subject. The RF pulses are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field B0 produced by a magnet means 11. The coils may be isolated from the remainder of the system by enclosure in an RF shielded cage.

Magnetic field gradient coils 12-1, 12-2 and 12-3 are necessary to provide gradients Gx, Gy and Gz, respectively, that are monotonic and linear over the sample volume. Multi-valued gradient fields cause a degradation in the MR response signal data, known as aliasing, which leads to severe image artifacts. Nonlinear gradients cause geometric distortions of the image.

Figure 2:
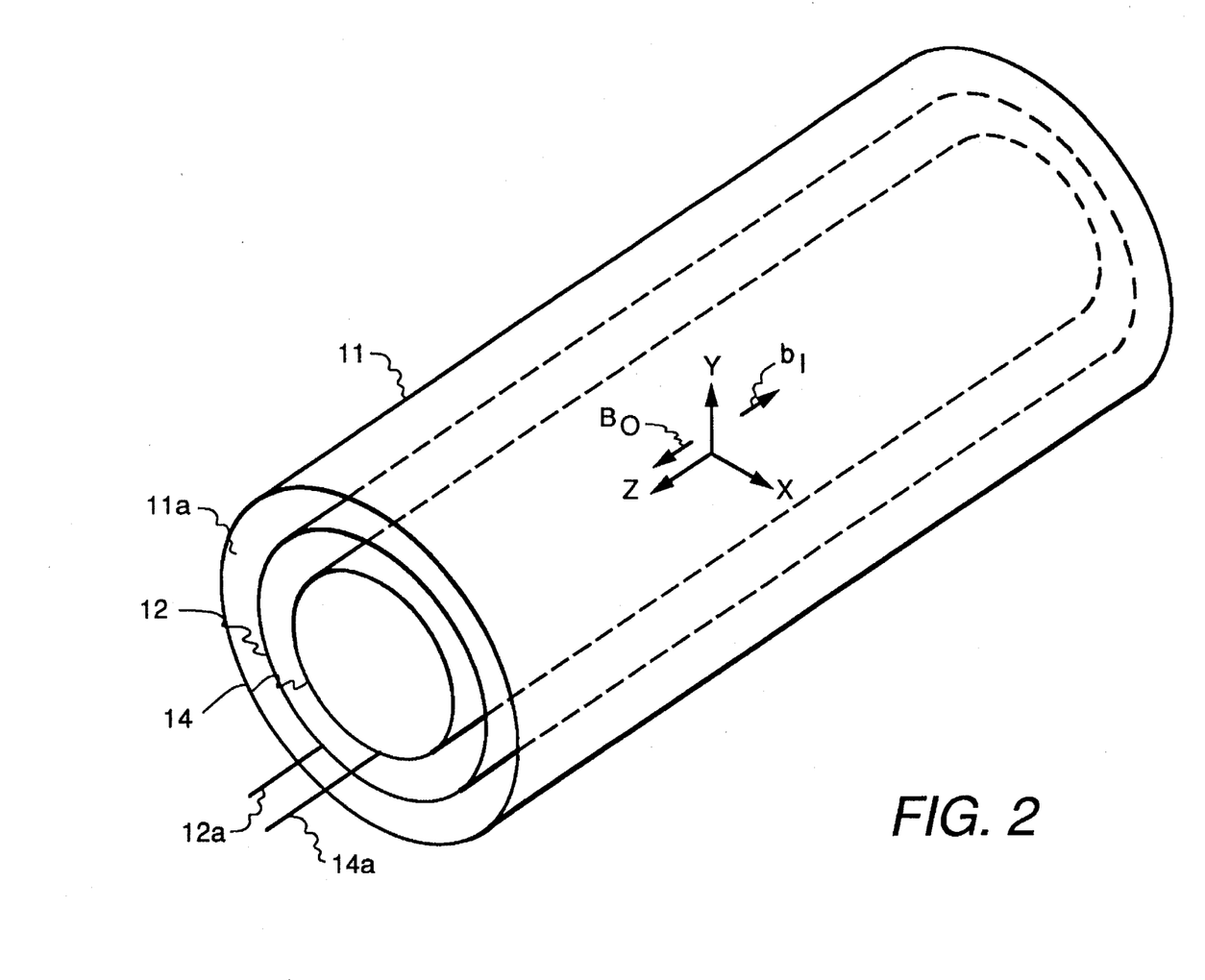
FIG. 2 is a more detailed diagram of the magnet assembly of FIG. 1.

Magnet assembly 11, shown schematically in FIG. 2, has a central cylindrical bore 11a which generates a static magnetic field B0, typically in the axial, or Z Cartesian coordinate direction. A set of coils 12, such as coils 12-1, 12-2 and 12-3 of FIG. 1, receive electrical signals via input connections 12a, and provide at least one gradient magnetic field within the volume of bore 11a. Also situated within bore 11a is an RF coil 14, which receives RF energy via at least one input cable 14a, to provide an RF magnetic field B1, typically in the X-Y plane.

Figure 3A:
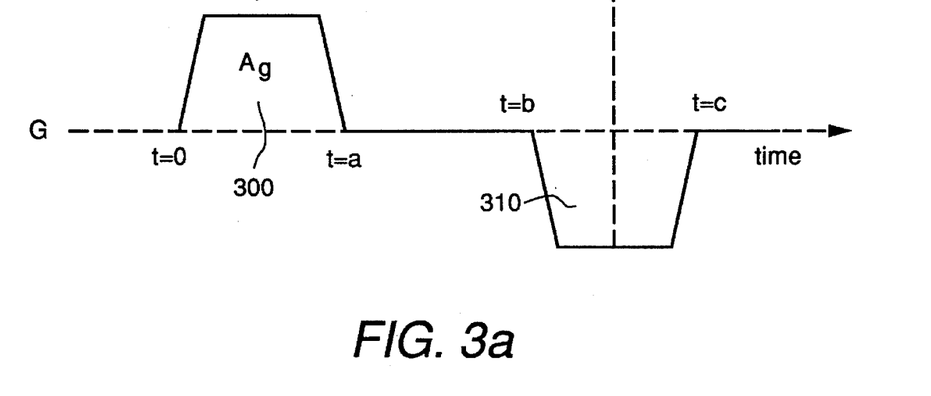
FIG. 3a is a graphical illustration of one embodiment of a velocity-encoding magnetic field gradient pulse sequence which is incorporated into a shear imaging pulse sequence.
Figure 3B:
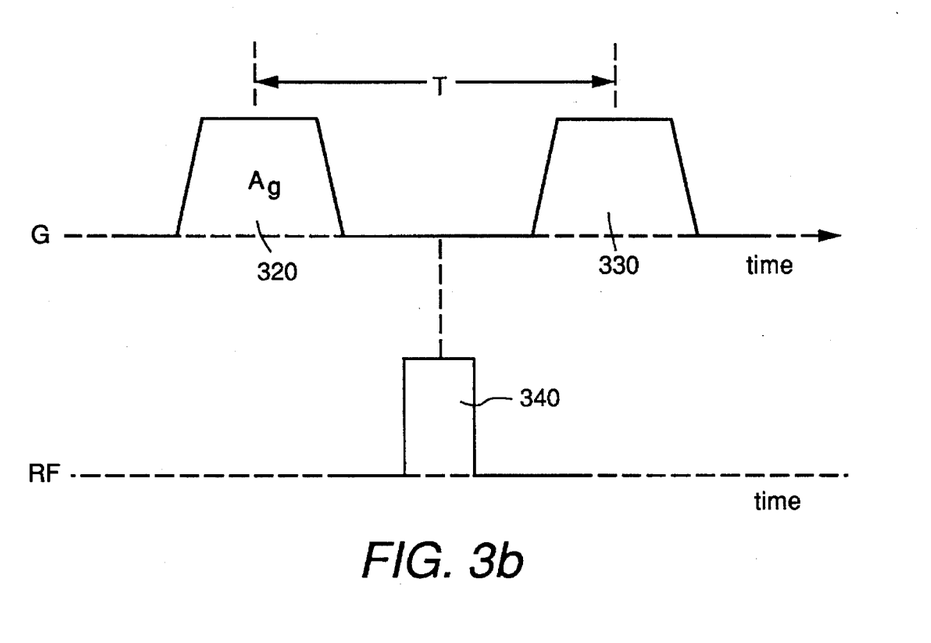
FIG. 3b is a graphical illustration of a second embodiment of a velocity-encoding magnetic field gradient pulse sequence.

FIGS. 3a and 3b show two embodiments of velocity-encoding magnetic field gradient pulse sequences. In FIG. 3a the magnetic field gradient has substantially zero intensity until time t=0. Beginning at t=0 and ending at t=a, a first magnetic field gradient pulse 300 is applied. Beginning at t=b and ending at t=c a second magnetic field gradient pulse 310 having substantially the same duration and intensity of the first gradient pulse, but having opposite polarity, is applied. The time interval between the two gradient pulses is T.

An alternative embodiment of this velocity-encoding gradient pulse is shown in FIG. 3b. This embodiment is similar to the embodiment shown in FIG. 3a with the exception of the addition of a refocusing RF pulse 340 placed between the gradient waveforms 320, 330 and the second waveform 330 having a polarity identical to that of the first gradient pulse 320.

Figure 4A:
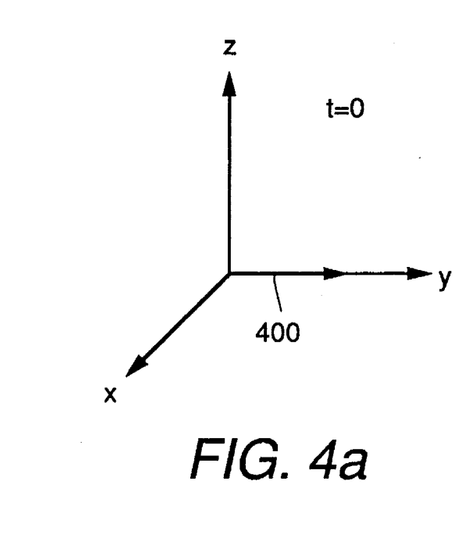
FIG. 4a–4c are vector illustrations of the effect of bipolar magnetic field gradient pulses on stationary spin magnetization.
Figure 4B:
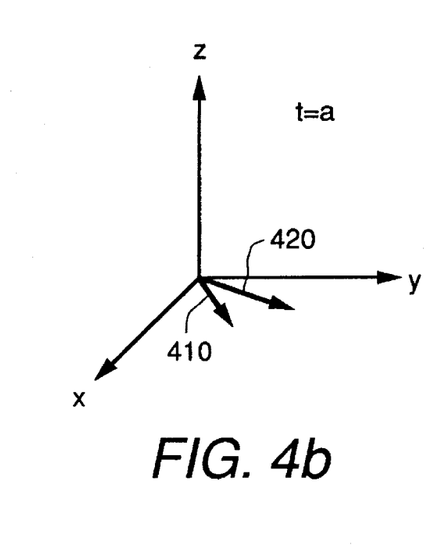
Figure 4C:
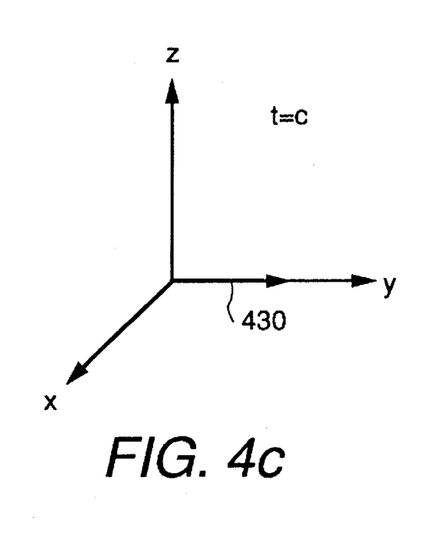

The application of magnetic field gradient pulse sequences such as those of FIGS. 3a and 3b results in a phase shift in transverse spin magnetization which is directly proportional to velocity, the area of each lobe of the pulse sequence being Ag, the gyromagnetic ratio of the nuclear species being γ and the time interval between successive gradient lobes being T. This relationship is well known to those skilled in the art and can be expressed as:

$$\Phi = \gamma V T A_g \quad [1]$$

where Φ is the velocity-induced phase shift and V is the velocity component of the nuclear spin parallel to the applied magnetic field gradient. The effect of a velocity-encoding magnetic field gradient pulse on a body of stationary spin magnetization is shown in FIGS. 4a–4c. For the purpose of illustration, only vectors corresponding to the transverse magnetization of two spins at different positions in the direction of the applied velocity-encoding gradient are shown. After the generation of transverse spin magnetization by an RF pulse, all the spins have the same phase and can be represented as a single vector 400 at time t=0, as shown in FIG. 4a. At time t=a, however, each spin has acquired a phase shift which is directly proportional to its position along the magnetic field gradient, as shown in FIG. 4b. These individual vectors 410, 420 arise from spins which do not change position and thus, when the second gradient pulse is applied the phase shifts generated by the first gradient pulse are exactly cancelled by the second gradient pulse. Consequently, the phase shifts at time t=c for each spin is identical, and the two vectors coincide and are represented as a single vector 430 in FIG. 4c. The phase shift at time t=c is substantially identical to the phase shift found at time t=0.

Figure 4D:
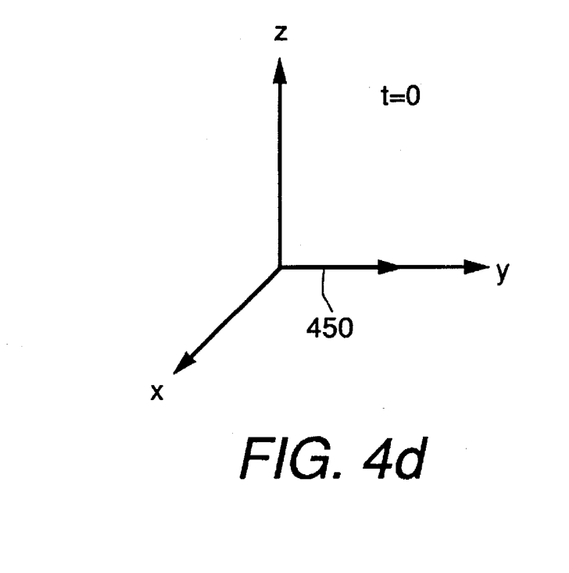
FIG. 4d–4f are vector illustrations of the effect of bipolar magnetic field gradient pulses on moving spin magnetization.
Figure 4E:
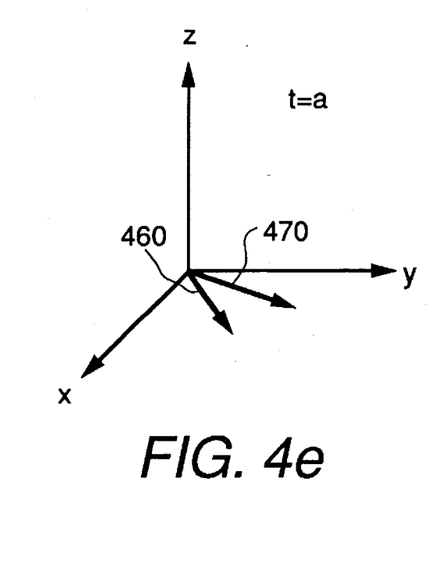
Figure 4F:
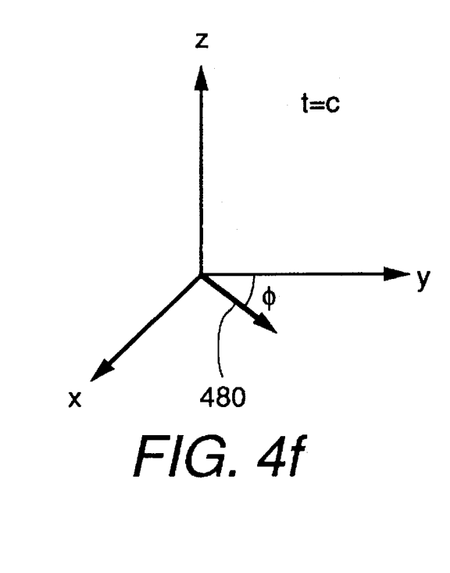

The effect of a velocity-encoding magnetic field gradient pulse on a body of moving spin magnetization shown in FIGS. 4d–4f differs from that on a body of stationary spin magnetization shown in FIGS. 4a–4c. For the purpose of illustration, only vectors corresponding to the transverse spin magnetization of two spins traveling at the same velocity, but at different positions in the direction of the applied velocity-encoding gradient, are shown. After the generation of transverse spin magnetization by an RF pulse, all the spins have the same phase and can be represented as a single vector 450 at time t=0, as shown in FIG. 4d. At time t=a, however, each spin has acquired a phase shift which is directly proportional to its position along the magnetic field gradient as shown by vectors 460, 470 in FIG. 4e. These individual vectors arise from spins which change position with time and thus, when the second gradient pulse is applied, the phase shifts generated by the first pulse are not entirely cancelled by the second gradient pulse. Consequently, the phase shift at time t=c, represented by the single vector 480 as shown in FIG. 4f, differs from the phase shift found at time t=0 by an amount Φ. This phase shift is directly proportional to velocity V of equation 1.

Figure 5:
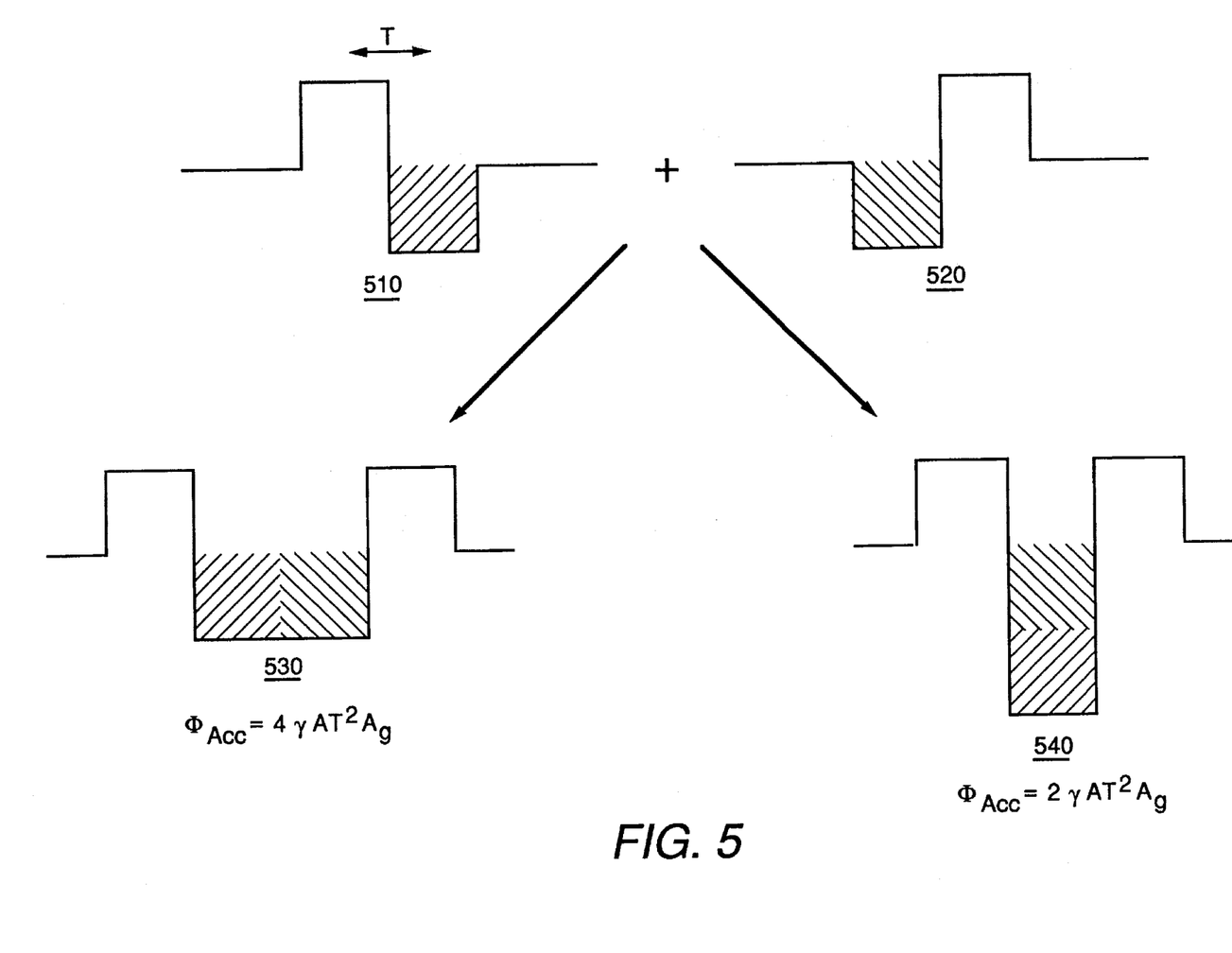
FIG. 5 is a graphical illustration of the formation of an acceleration-encoding magnetic field gradient pulse by combining two velocity-encoding magnetic field gradient pulses.

FIG. 5 illustrates how higher order motion-encoding magnetic field gradient pulses can be constructed from the velocity-encoding magnetic field gradient pulses shown in FIG. 3. Since acceleration is defined as the change in velocity with respect to time, acceleration can be measured by applying a first velocity-encoding gradient pulse 510 followed by a second velocity-encoding gradient pulse 520. Second velocity-encoding gradient pulse 520 has a polarity opposite to that of first velocity-encoding pulse 510. Consequently, for spin magnetization having constant velocity, the velocity-induced phase shifts created by first velocity-encoding pulse 510 will be cancelled by the velocity-induced phase shifts created by second velocity-encoding pulse 520. If the velocity of the detected spin magnetization changes in the interval between the first and second velocity-encoding pulses, however, the cancellation of phase will be incomplete and the residual phase shift will be directly proportional to acceleration First velocity-encoding pulse 510 and second velocity-encoding pulse 520 are combined in two different ways in FIG. 5 to generate acceleration-encoding gradient pulses. When the velocity-encoding pulses are combined and the amplitude of the gradient waveforms are conserved, an equal amplitude acceleration-encoding gradient pulse 530 is generated. If, however, the velocity-encoding pulses are combined and the lobe duration of the waveforms is conserved, an equal duration acceleration-encoding pulse 540 is generated. Note that the acceleration-induced phase shifts of equal amplitude acceleration-encoding pulse 530 are twice that of equal duration acceleration-encoding pulse 540, where the phase shift $\Phi_{acc}$ observed with gradient 530 is:

$$\Phi_{acc}=4\gamma AT^2 A_g; \quad [2]$$

and the the phase shift observed with gradient 540 is:

$$\Phi_{acc}=2\gamma AT^2 A_g. \quad [3]$$

Figure 6:
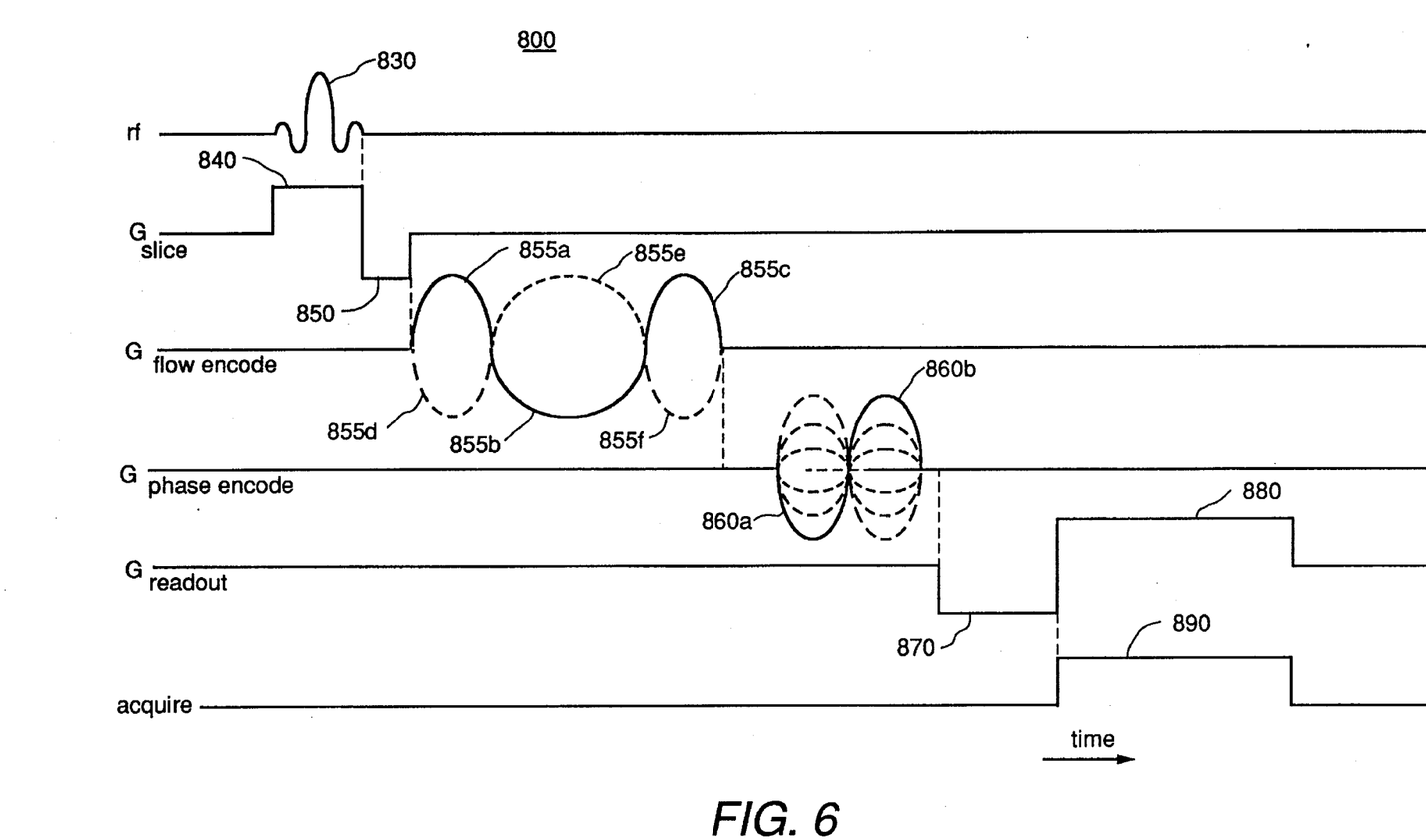
FIG. 6 is pulse sequence diagram of a third embodiment of the present invention which can be used to measure velocity and acceleration, where the velocity measurement defines one dimension of the image.

FIG. 6 is a pulse sequence diagram of radio frequency (RF) pulses and magnetic field gradients employed in a third embodiment of the present invention which may be executed by the MR imaging system of FIGS. 1 and 2. Pulse sequence 800 is comprised of an excitation RF pulse 830 which is applied in the presence of a slice selective magnetic field gradient pulse 840. Excitation pulse 830 nutates spin magnetization in a selected portion of the subject. The amount of nutation can be selected by selecting the duration and amplitude of detection pulse 830. The location and size of the selected portion can be adjusted by appropriate selection of the frequency and bandwidth of RF pulse 830 and the amplitude of slice selective magnetic field gradient pulse.

After the excitation RF pulse 830 and slice selective magnetic field gradient pulse 840 are applied, a slice refocusing magnetic field gradient pulse 850 is applied. Slice refocusing gradient pulse 850 has an amplitude and duration which is selected to cause all transverse spin magnetization within the selected portion of the subject to be substantially in phase after the application of slice refocusing gradient pulse 840. In the present embodiment the product of the amplitude and duration of slice refocusing gradient pulse 850 is substantially half that of the negative of the product of the amplitude and duration of slice selective gradient pulse 840 in a manner well known to those skilled in the art.

After excitation RF pulse 830 and slice selection gradient pulse 840 have been applied, a tripolar acceleration-encoding magnetic field gradient pulse is applied in a selected direction. The acceleration-encoding pulse consists of a first acceleration-encoding magnetic field gradient pulse lobe 855a, a second acceleration-encoding magnetic field gradient pulse lobe 855b and a third acceleration-encoding magnetic field gradient pulse lobe 855c. The product of the pulse duration and amplitude of third acceleration-encoding pulse lobe 855c is substantially equal to the product of the pulse duration and amplitude of the first velocity-encoding pulse lobe 855a as described in FIG. 5. The product of the pulse duration and amplitude of second acceleration-encoding pulse lobe 855b is substantially equal to the negative of twice the product of the pulse duration and amplitude of the first velocity-encoding pulse lobe 855a as described in FIG. 5.

Successive application of first acceleration-encoding pulse lobe 855a, second acceleration-encoding pulse lobe 855b and third acceleration-encoding pulse lobe 855c to transverse spin magnetization causes a phase shift in the magnetization which is proportional to the acceleration component of the magnetization parallel to the direction of the acceleration-encoding magnetic field gradient. This phase shift can be used to distinguish accelerating from stationary and constant velocity transverse spin magnetization.

After excitation RF pulse 830 and slice selection gradient pulse 840 have been applied, a bipolar phase encoding magnetic field gradient pulse of a selected amplitude is applied. The bipolar phase-encoding pulse consists of a first phase-encoding magnetic field gradient pulse lobe 860a and a second phase-encoding magnetic field gradient pulse lobe 860b. Phase encoding gradient pulse lobes 860a, 860b are applied in a direction independent of acceleration-encoding gradient pulses 855a, 855b, 855c and can be applied simultaneously with slice refocusing pulse 850 if desired. For the sake of clarity, phase encoding pulse lobes 860a, 860b, acceleration-encoding pulses 855a, 855b, 855c and slice refocusing pulse 850 are not shown to be simultaneous in FIG. 7, but it is possible to apply combinations of these pulses simultaneously.

After excitation RF pulse 830 and slice selective gradient pulse 840 have been applied, a readout dephasing magnetic field gradient pulse 870 of a selected amplitude is applied. Readout dephasing gradient pulse 870 is applied in a direction substantially orthogonal to slice selective gradient pulse 840. Readout dephasing pulse 870 can be applied simultaneously with either slice refocusing pulse 850 or phase encoding pulse lobes 860a, 860b if desired. Readout dephasing pulse 870 causes transverse magnetization at different positions along the direction of the readout dephasing magnetic field gradient to obtain phase shifts which are proportional to position in the readout direction.

Following the application of slice refocusing pulse 850, phase encoding pulse lobes 860a, 860b and readout dephasing pulse 870, a readout magnetic field gradient pulse 880 is applied. Readout pulse 880 is applied in the same direction as readout dephasing pulse 870, but is given the opposite polarity. The amplitude and duration of readout pulse 880 is selected so that substantially all transverse spin magnetization has an identical phase shift at a selected point during readout pulse 880.

Substantially simultaneously with readout pulse 880, a data acquire signal pulse 890 is sent to a data acquisition subsystem which is part of the imaging system. MR signals are digitized during data acquire pulse 890. Since the MR signals coming from transverse spin magnetization within the selected portion of the subject are acquired during readout magnetic field gradient 880, each detected MR signal will have a frequency which is proportional to the location of the position of the transverse spin magnetization which generated said signal. The location of each signal source can be determined by applying a Fourier transformation to the acquired signal data in a fashion well known to those skilled in the art.

In the present invention pulse sequence 800 is repeated a plurality, N, times to form a single frame of data which has sufficient information to permit the measurement of at least one component of motion. The acquisition of a frame is repeated a plurality, Y, times. In each frame acquisition, phase encoding pulse lobes 860a, 860b are given a different amplitude. Phase encoding pulse lobes 860a, 860b cause phase shifts in the detected MR signals which are proportional to the velocity of transverse spin magnetization in the direction of phase encoding magnetic field gradient lobes 860a, 860b. Data acquired responsive to different amplitudes of phase encoding gradient lobes 860a, 860b can be Fourier transformed to give the velocity (in the direction of phase encoding gradient lobes 860a, 860b) of the signal producing transverse spin magnetization in a manner well known to those skilled in the art.

In the present embodiment of the present invention, each frame consists of N=2 applications of pulse sequence 800. In the first application, acceleration-encoding gradient pulses 855a, 855b, 855c are applied with a selected polarity. This causes the phase of the transverse spin magnetization to be proportional to the component of acceleration in the direction of acceleration-encoding gradient pulses 855a, 855b, 855c. The phase of each portion of transverse spin magnetization, however, will also have contributions from sources other than acceleration. These sources may include transmitter offsets, chemical shift effects and eddy currents.

In order to remove contributions from all components other than acceleration, pulse sequence 800 is applied a second time and a second data set is acquired. The RF and magnetic field gradient pulses of the second application are identical to that of the first with the exception of first acceleration-encoding pulse lobe 855a, second acceleration-encoding pulse lobe 855b and third acceleration-encoding pulse lobe 855c. In their place a fourth acceleration-encoding pulse lobe 855d followed by a fifth acceleration-encoding pulse lobe 855e and a sixth acceleration-encoding pulse lobe 855f are applied. Fourth, fifth and sixth acceleration-encoding pulse lobes 855d, 855e, 855f are identical to first, second and third acceleration-encoding pulse lobes 855a, 855b, 855c respectively, except that they have opposite polarity. Data collected in the first application is then subtracted from data collected in the second application to give a difference data set. Phase shifts induced by the fourth, fifth and sixth acceleration-encoding gradient lobes have opposite polarity relative to the phase shifts induced by the first, second and third acceleration-encoding gradient lobes. When the phase of data acquired responsive to the first application of pulse sequence 800 is subtracted from the phase of the data acquired responsive to the second application of pulse sequence 800, phase contributions from all non-acceleration sources are substantially canceled, leaving only a phase shift arising from acceleration. This phase shift is directly proportional to acceleration and can be used to quantify acceleration.

Figure 7:
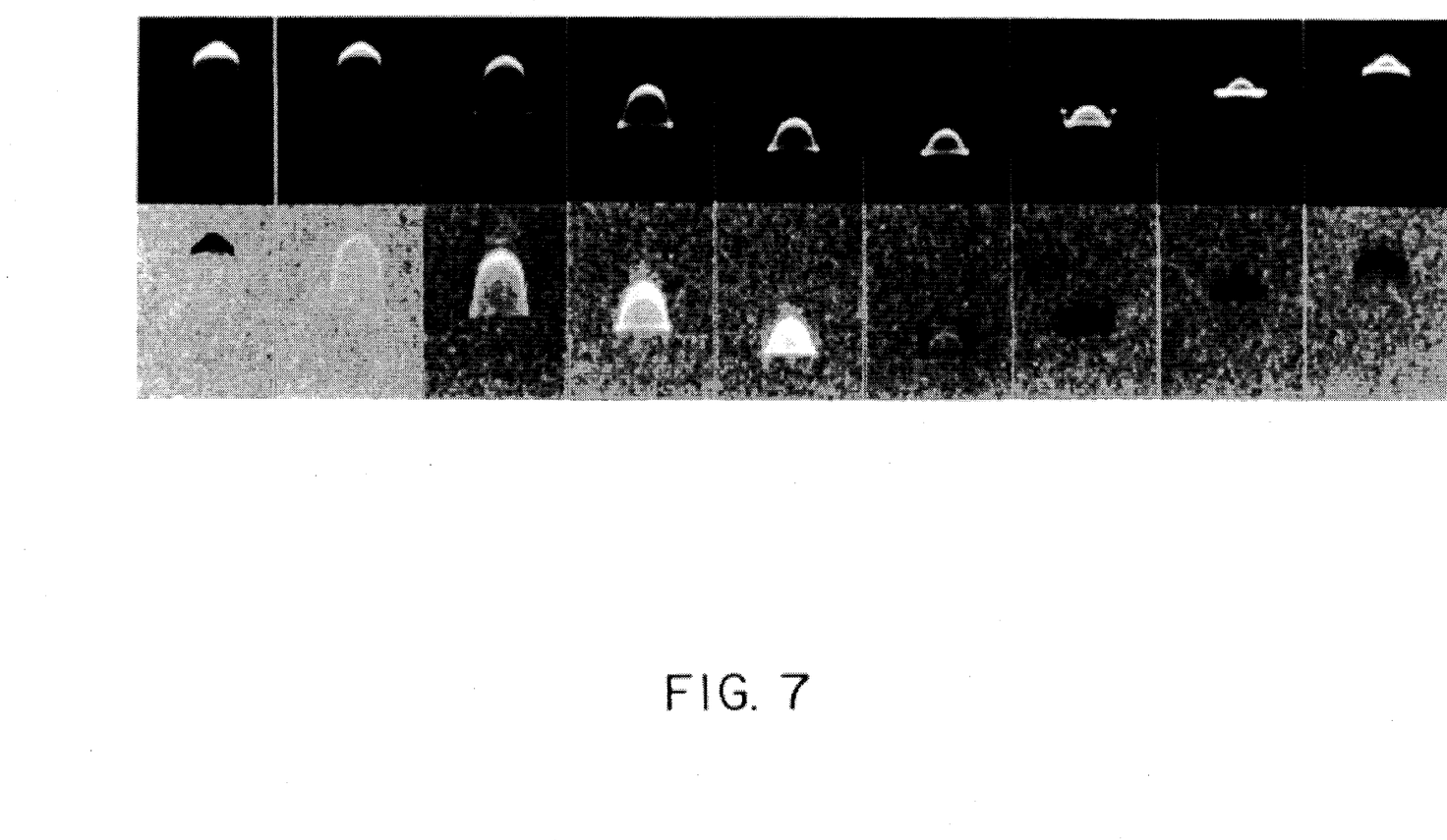
FIG. 7 is a set of MR images collected using the present invention.

FIG. 7 shows the MR response signals for one application of the present invention. These images were obtained from a phantom constructed with a rigid tube. Non-steady flow of water in the tube was accomplished by attaching the phantom to an oscillating pump. The oscillating pump caused the velocity of water within the phantom to accelerate and decelerate with a period of approximately one second. A series of nine images, each acquired afar a selected delay from a trigger signal generated by the pump, were obtained.

In the images of FIG. 7, the horizontal axis of each image is a spatial dimension across the diameter of the tube. The vertical axis of each image is velocity in the axial direction of the tube. The MR response signals are complex in nature and each image in FIG. 7 has two parts. The first part, shown in each upper frame, is the magnitude of the MR response signal. Pixels in the magnitude image have an intensity proportional to the number of nuclear spins having the velocity and location corresponding to the pixel. Pixels in the phase image, lower frame of each, however, have an intensity proportional to the acceleration of the nuclear spins having the velocity and location corresponding to the pixel. Note that in the sixth frame, the water in the tube exhibits simultaneously regions of acceleration and deceleration.

The present invention has several applications in medical imaging. For example, it may be used to examine the velocity profile within a selected blood vessel. Pulsatile flow in a normal vessel is known to be very different of that having stenosis. Simultaneous detection of both velocity and acceleration may be particularly useful in measuring the physiological state of the blood vessel. This may be very useful in predicting arteriosclerotic disease.

Numerous additional embodiments of the present invention should be apparent to those skilled in the art. For example, the velocity and acceleration encoding gradient pulses used in the previously described embodiments can be replaced with encoding gradient pulses which induce phase shifts from higher orders of motion such as jerk. These gradient pulses can be constructed by taking linear combinations of velocity and acceleration encoding gradients in a manner analogous to that illustrated in FIG. 5. Other embodiments of the present invention can be created by adding additional phase-encoding gradient pulses to form additional dimensions in the resulting image. These dimensions can be spatial, velocity, acceleration or higher order components of motion.

While several presently preferred embodiments of the novel MR motion imaging method have been described in detail herein, many modifications and variations will now become apparent to those skilled in the art. It is, therefore, to be understood that the appended claims are intended to cover all such modifications and variations as fall within the true spirit of the invention.

What is claimed is:

1. A method of simultaneous detection of multiple components of motion of a material within a subject comprising the steps of:

a) placing said subject into a magnetic field to polarize nuclear spins;

b) applying a radiofrequency (RF) pulse of a selected frequency and amplitude;

c) applying a slice select magnetic field gradient in a slice select direction perpendicular to a slice desired to be imaged, simultaneously with the application of the RF pulse, thereby causing nutation of resonant nuclei, 'nuclear spins' in a slice of said subject, to create transverse spin magnetization;

d) applying an acceleration-encoding magnetic field gradient pulse of a selected polarity, in an acceleration-encoding direction, to said subject to cause the transverse spin magnetization to acquire an acceleration-induced phase shift;

e) applying a higher-order phase encoding pulse, being a magnetic field gradient pulse of a selected amplitude which induces a phase shift proportional to velocity and is oriented in a phase encoding direction which is independent of the slice select direction and the acceleration-encoding direction f) applying a readout magnetic field gradient pulse in a readout direction substantially orthogonal to the slice-select direction;

g) acquiring an MR response signal in the presence of the readout magnetic field gradient pulse;

h) Fourier transforming the MR response signal to result in an intermediate data set;

i) repeating steps 'b'–'h' plurality, Y times, each repetition having a unique amplitude for the higher order phase encoding gradient pulse; to result in Y intermediate data sets;

j) Fourier transforming the Y intermediate data sets with respect to the amplitudes of the higher order phase encoding pulse to result in a complex two dimensional (2D) transformed data set having a spatial first dimension, and a velocity second dimension, the 2D transformed data set having a plurality of complex entries with the phase of each complex entry indicating acceleration, and the amplitude indicating the number of nuclear spins at a given velocity and spatial position of the material within said subject.

2. A method of simultaneous detection of multiple components of motion of a material within a subject comprising the steps of:

a) placing said subject into a magnetic field to polarize nuclear spins;

b) applying a radiofrequency (RF) pulse of a selected frequency and amplitude;

c) applying a slice-select magnetic field gradient in a slice select direction perpendicular to a slice desired to be imaged, simultaneously with the application of the RF pulse, thereby causing nutation of resonant nuclei, 'nuclear spins' in a slice of said subject, to create transverse spin magnetization;

d) applying an acceleration-encoding magnetic field gradient pulse of a selected polarity, in an acceleration-encoding direction, to said subject to cause the transverse spin magnetization to acquire an acceleration-induced phase shift;

e) applying a higher-order phase encoding pulse, being a magnetic field gradient pulse of a selected amplitude which induces a phase shift proportional to velocity and is oriented in a phase encoding direction which is independent of the slice-select direction and the acceleration-encoding direction f) applying a readout magnetic field gradient pulse in a readout direction substantially orthogonal to the slice-select direction;

g) acquiring a first MR response signal in the presence of the readout magnetic field gradient pulse;

h) repeating steps 'b'–'g' to acquire a second MR response signal;

i) subtracting the first MR response signal from the second MR response signal to result in a difference data set;

j) Fourier transforming the difference data set to result in an intermediate data set;

k) repeating steps 'b'–'j' a plurality, Y times, each repetition having a unique amplitude for the higher order phase encoding gradient pulse; to result in Y intermediate data sets;

l) Fourier transforming the Y intermediate data sets with respect to the amplitudes of the higher order phase encoding pulse to result in a complex two dimensional (2D) transformed data set having a spatial first dimension, and a velocity second dimension, the 2D transformed data set having a plurality of complex entries with the phase of each complex entry indicating acceleration, and the amplitude indicating the number of nuclear spins at a given velocity and spatial position of the material within said subject.

* * * * *